United States Patent
Lee et al.

(10) Patent No.: US 6,914,003 B2
(45) Date of Patent: Jul. 5, 2005

(54) METHOD FOR MANUFACTURING MAGNETIC RANDOM ACCESS MEMORY

(75) Inventors: Kye Nam Lee, Ichon-shi (KR); Young Jin Park, Ichon-shi (KR); Chang Shuk Kim, Ichon-shi (KR); In Woo Jang, Seoul (KR); Hee Kyung, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 310 days.

(21) Appl. No.: 10/334,879

(22) Filed: Dec. 31, 2002

(65) Prior Publication Data

US 2003/0224608 A1 Dec. 4, 2003

(30) Foreign Application Priority Data

May 29, 2002 (KR) .............................. 10-2002-0029792

(51) Int. Cl.[7] .............................................. H01L 21/302
(52) U.S. Cl. ................. 438/694; 3/240; 3/700; 3/951
(58) Field of Search ............................. 438/3, 240, 951, 438/694, 700

(56) References Cited

U.S. PATENT DOCUMENTS

| | | | |
|---|---|---|---|
| 5,767,007 A | * | 6/1998 | Uchibori et al. ............ 438/604 |
| 6,153,443 A | | 11/2000 | Durlam et al. |
| 6,545,900 B2 | * | 4/2003 | Bohm et al. ................. 365/97 |
| 2002/0037595 A1 | | 3/2002 | Hosotani |

FOREIGN PATENT DOCUMENTS

| | | |
|---|---|---|
| DE | 44 25 331 | 1/1996 |
| DE | 44 34 912 | 4/1996 |
| DE | 100 45 042 | 5/2002 |
| JP | 57040933 | 3/1982 |
| JP | 07094444 | 4/1995 |
| JP | 2002009366 | 1/2002 |
| WO | WO/91/14288 | 9/1991 |

OTHER PUBLICATIONS

Search Report from German Patent and Trademark Office dated Dec. 2, 2003 (3 pages).

* cited by examiner

*Primary Examiner*—George A. Goudreau
(74) *Attorney, Agent, or Firm*—Marshall, Gerstein & Borun LLP

(57) ABSTRACT

A method for manufacturing a magnetic random access memory is disclosed. An interlayer insulating film is formed on a lower read layer, a cell region of the interlayer insulating film is etched according to a photo etching process using a cell mask, and a MTJ layer is formed on the lower read layer of the cell region and the interlayer insulating film of a peripheral circuit region. The sidewall of the interlayer insulating film is exposed, the MTJ layer is left merely in the cell region by lifting off the interlayer insulating film, and a bit line which is an upper read layer connected to the MTJ layer is formed in a succeeding process. Accordingly, an effective area of an MTJ cell is obtained and the properties and reliability of the MRAM are improved.

11 Claims, 6 Drawing Sheets

METHOD FOR MANUFACTURING MAGNETIC RANDOM ACCESS MEMORY

BACKGROUND

1. Technical Field

Methods for manufacturing a magnetic random access memory (abbreviated as 'MRAM') are disclosed. More specifically, improved methods for manufacturing a MRAM are disclosed which improve a process margin and prevent damage to the MRAM during the manufacturing process to allow a facile manufacturing process of the MRAM which has a higher speed than a SRAM, integration density as high as a DRAM, and the properties of a nonvolatile memory such as a flash memory.

2. Description of the Related Art

Most of the semiconductor memory manufacturing companies have developed the MRAM which uses a ferromagnetic material as one of the next generation memory devices.

The MRAM is a memory device for reading and writing information wherein multi-layer ferromagnetic thin films is used by sensing current variations according to a magnetization direction of the respective thin films. The MRAM has a high speed and low power consumption, and allows high integration density due to its unique properties of the magnetic thin film, and also performs a nonvolatile memory operation such as a flash memory.

The MRAM embodies a memory device by using a giant magneto resistive (GMR) or spin-polarized magneto-transmission (SPMT) phenomenon generated when the spin influences electron transmission.

The MRAM using the GMR phenomenon utilizes the fact that resistance remarkably varies when spin directions are different in two magnetic layers having a non-magnetic layer therebetween to embody a GMR magnetic memory device.

The MRAM using the SPMT phenomenon utilizes the fact that larger current transmission is generated when spin directions are identical in two magnetic layers having an insulating layer therebetween to embody a magnetic permeable junction memory device.

However, the MRAM research is still in its early stage, and concentrated more on the formation of multi-layer magnetic thin films, but less on the researches on a unit cell structure and a peripheral sensing circuit.

FIGS. 1a to 1i are cross-sectional diagrams illustrating sequential steps of a conventional method for manufacturing an MRAM, wherein both a cell region 100 and a peripheral circuit region 200 are shown.

Referring to FIG. 1a, a transistor (not shown) is formed on a semiconductor substrate (not shown), a ground line (not shown) connected to a source region (not shown) of the transistor is formed, and a first interlayer insulating film 11 planarizing the top surface of the resultant structure is formed.

A connection layer 13 which is a lower read layer connected to the drain region (not shown) of the transistor through the first interlayer insulating film 11 is formed.

Here, the connection layer 13 is composed of a metal.

Referring to FIG. 1b, a magnetic tunnel junction (MTJ) layer 15 is formed on the connection layer 13.

The MTJ layer 15 comprises a stacked structure of a semi-ferromagnetic layer, a pinned ferromagnetic layer and a free ferromagnetic layer.

Referring to FIG. 1c, a first photoresist film pattern 17 is formed on the MTJ layer 15.

Here, the first photoresist film pattern 17 is formed only on a portion of the MTJ layer 15 in the cell region 100 according to exposure and development processes using a MTJ cell mask (not shown).

Referring to FIGS. 1d and 1e, the MTJ layer 15 is etched using the first photoresist film pattern 17 as a mask to form a MTJ layer pattern 16. Thereafter, the first photoresist film pattern 17 is removed.

The etching process is a plasma etching process which damages the surface of the metal composing the connection layer 13. A defect layer 19 is formed due to this damage.

Referring to FIG. 1f, a second interlayer insulating film 21 planarizing the top surface of the resultant structure is formed.

Referring to FIG. 1g, a second photoresist film pattern 23 is formed on the second interlayer insulating film 21.

Here, the second photoresist film pattern 23 is formed according to exposure and development processes using a bit line contact mask (not shown) for forming a bit line which is an upper read layer. The second photoresist film pattern 23 exposes a portion of the second interlayer insulating film 21 on the MTJ layer pattern 16 of the cell region 100 and a portion of the second interlayer insulating film 21 on the connection layer 13 of the peripheral circuit region 200.

Referring to FIG. 1h, the second interlayer insulating film 21 is etched using the second photoresist film pattern 23 as a mask to form a first contact hole 25 and a second contact hole 27 respectively exposing the MTJ layer pattern 16 of the cell region 100 and the connection layer 13 of the peripheral circuit region 200.

At this time, the exposed portion 29 of the connection layer 13 has a high resistance due to the defective layer 19 at the bottom of the second contact hole 27. Accordingly, a resistance of a contact formed in a subsequent process is increased.

Referring to FIG. 1i, a bit line 31 which is an upper lead line connected to the MTJ layer pattern 16 and the connection layer 13 through the first and second contact holes 25 and 27 is formed. Here, an MTJ cell region is restricted to the region of the MTJ layer pattern 16 contacted by the bit line 31.

In the conventional method for manufacturing the MRAM, a defective layer is formed due to damages on the surface of the connection layer which is the lower read layer during the patterning process of the MTJ layer and the MTJ cell region is restricted to the region of the MTJ layer pattern contacted by the bit line which is the upper lead line.

SUMMARY OF THE DISCLOSURE

Accordingly, methods for manufacturing a MRAM are disclosed which improve the properties and reliability of the MRAMs and prevent damages to a connection layer which is a lower read layer of an MTJ layer. The disclosed methods also provide a sufficient MTJ cell region by forming the MTJ layer in a cell region according to a lift-off process and form a contact as large as the MTJ cell region to a bit line which is an upper lead line.

One disclosed method for manufacturing a MRAM comprises: forming a lower read layer on a semiconductor substrate having a predetermined lower structure including a cell region and a peripheral circuit region; forming an interlayer insulating film on the lower read layer; etching a portion of the interlayer insulating film in the cell region to expose the lower read layer; forming a MTJ layer on the exposed portion of lower read layer and on the interlayer insulating film in the peripheral circuit region, wherein the MTJ layer has a predetermined thickness that allows partial exposure of the sidewall of the interlayer insulating film; lifting off the MTJ layer and the interlayer insulating film in the peripheral circuit region; and forming a bit line which is an upper read layer connected to the MTJ layer, the lower read layer is a connection layer the MTJ layer has a thickness that is from about 500 to about 5000 Å less than that of the interlayer insulating film, the MTJ layer further comprises a stacked structure of a pinned ferromagnetic layer, a tunnel barrier layer and a free ferromagnetic layer, and the MTJ layer has a thickness ranging from about 450 to about 600 Å.

Another disclosed method for manufacturing a MRAM comprises: forming a lower read layer on a semiconductor substrate having a predetermined lower structure including a cell region and a peripheral circuit region; forming a first interlayer insulating film on the lower read layer; etching a portion of the first interlayer insulating film in the cell region to expose the lower read layer; forming a MTJ layer on the exposed portion of lower read layer and on the first insulating film in the peripheral circuit region wherein the MTJ layer has a predetermined thickness that allows partial exposure of the sidewall of the first interlayer insulating film; lifting off the MTJ layer and the first interlayer insulating film of the peripheral circuit region; forming a second interlayer insulating film having a first contact hole and a second contact hole respectively exposing a MTJ active region in the cell region and the lower read layer in the peripheral circuit region; and forming a bit line which is an upper read layer filling the first contact hole and the second contact hole on the top surface of the resultant structure, wherein the lower read layer is a connection layer comprising a metal, the MTJ layer has a thickness which is from about 500 to about 5000 Å less than that of the interlayer insulating film, the MTJ layer comprises a stacked structure of a pinned ferromagnetic layer, a tunnel barrier layer and a free ferromagnetic layer, the MTJ layer has a thickness ranging from about 450 to about 600 Å, the step of forming the second interlayer insulating film comprises photo etching process wherein an exposure mask which is a composite of an MTJ mask exposing the MTJ active region of the cell region and a contact mask exposing a lower read layer contact region of the peripheral circuit region.

The lift-off process for leaving the MTJ layer in the cell region on the lower read layer is performed in order to prevent the connection layer which is the lower read layer from being damaged during the patterning process of the MTJ active region.

In addition, the bit line which is the upper read layer connected to the MTJ layer and the connection layer which is the lower read layer are formed by using the separate exposure mask which is composite the MTJ mask exposing the MTJ active region of the cell region and the contact mask exposing the contact region of the connection layer which is the lower read layer of the peripheral circuit region. Therefore, an effective area of the MTJ layer is obtained by connecting the bit line to MTJ active region having a predetermined size.

BRIEF DESCRIPTION OF THE DRAWINGS

The disclosed methods will become better understood with reference to the accompanying drawings which are given only by way of illustration and thus are not limitative of this disclosure. In the drawings.

DETAILED DESCRIPTION OF THE PRESENTLY PREFERRED EMBODIMENTS

A method for manufacturing an MRAM in accordance with a preferred embodiment will now be described in detail with reference to the accompanying drawings.

FIGS. 2a to 2h are cross-sectional diagrams illustrating sequential steps of the method for manufacturing the MRAM wherein both a cell region 300 and a peripheral circuit region 400 are shown.

Figure 1A:
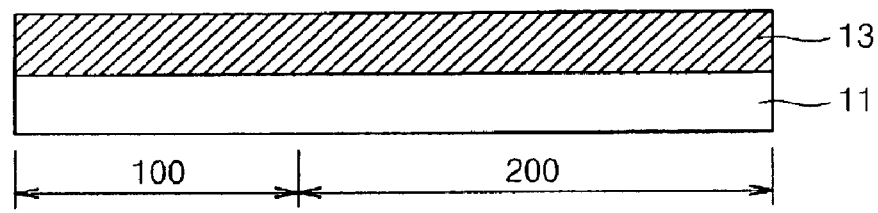
FIGS. 1a to 1i are cross-sectional diagrams illustrating sequential steps of a conventional method for manufacturing an MRAM.
Figure 1B:
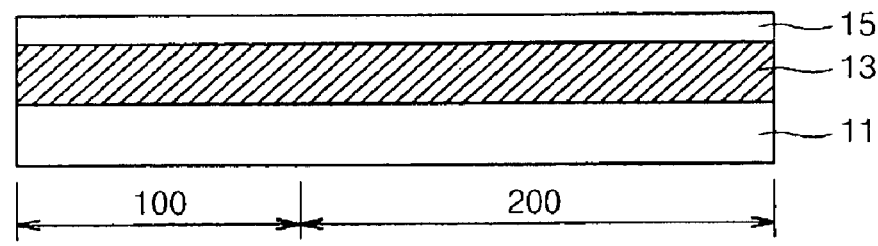
Figure 1C:
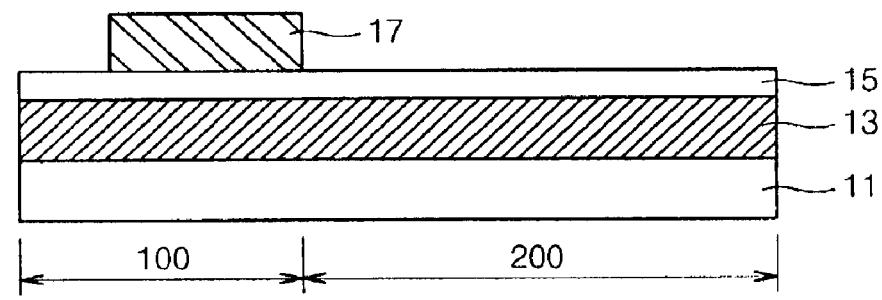
Figure 1D:
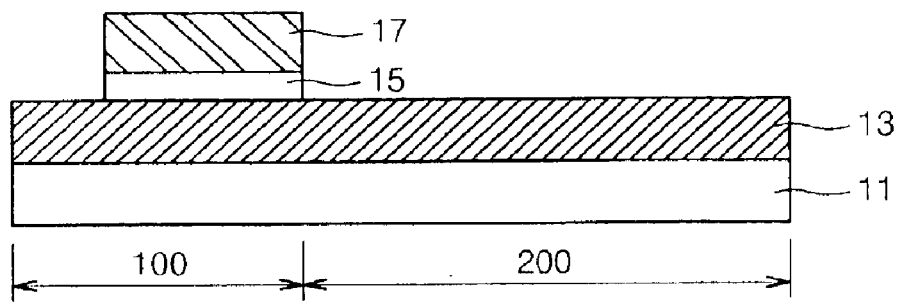
Figure 1E:
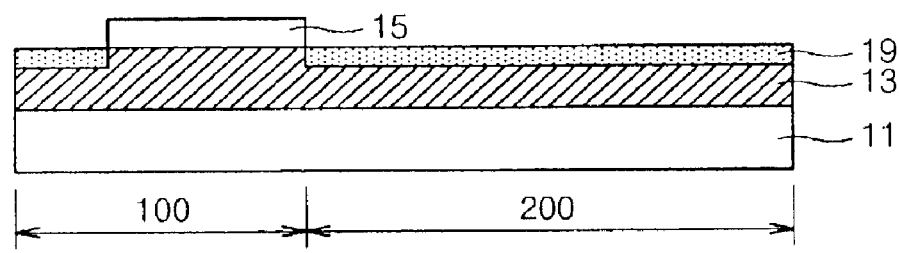
Figure 1F:
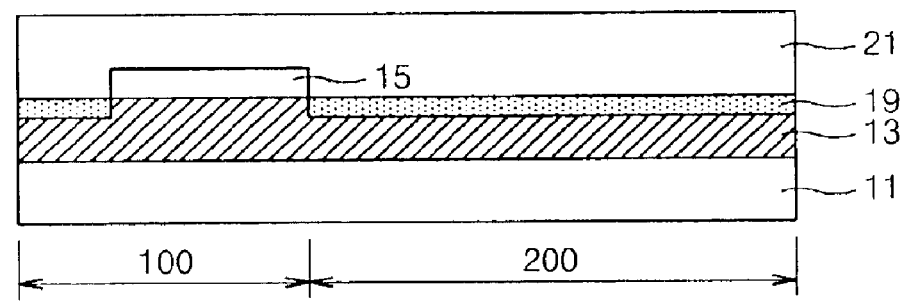
Figure 1G:
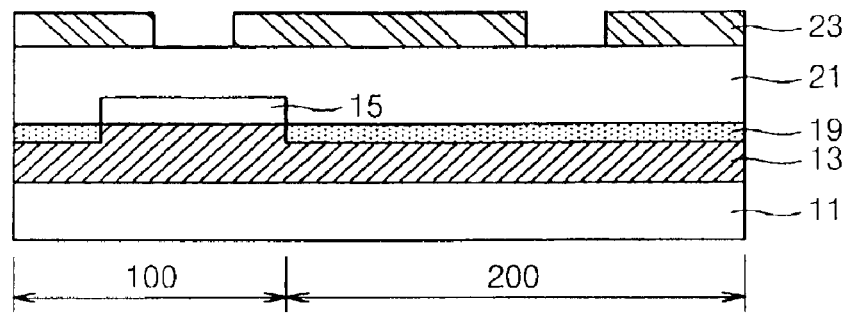
Figure 1H:
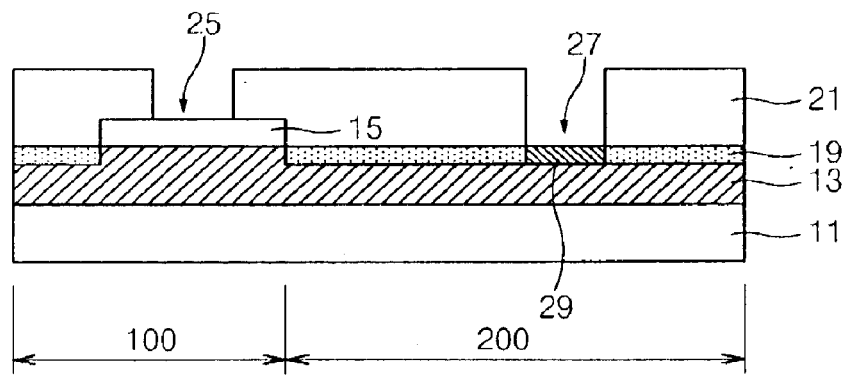
Figure 1I:
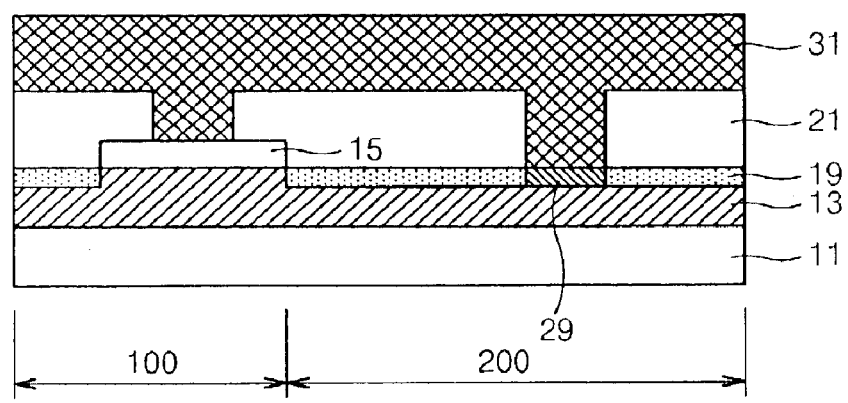
Figure 2A:
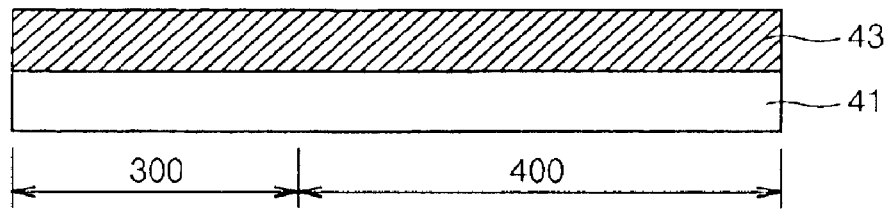
FIGS. 2a to 2h are cross-sectional diagrams illustrating sequential steps of a method for manufacturing an MRAM in accordance with a preferred embodiment.

Referring to FIG. 2a, a transistor (not shown) is formed on a semiconductor substrate (not shown), a ground line (not shown) connected to a source region (not shown) of the transistor is formed, and a first interlayer insulating film 41 planarizing the top surface of the resultant structure is formed.

A lower read layer connected to the drain region (not shown) of the transistor through the first interlayer insulating film 41, namely a connection layer 43 is formed.

Preferably, the connection layer 43 is composed of a metal.

Figure 2B:
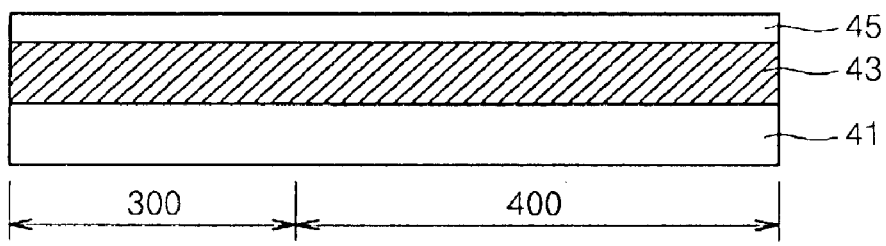

Referring to FIG. 2b, a second interlayer insulating film 45 is formed on the connection layer 43. Here, the second interlayer insulating film 45 is preferably thicker than an MTJ layer formed in a subsequent process by about 400 to about 5000 Å.

Figure 2C:
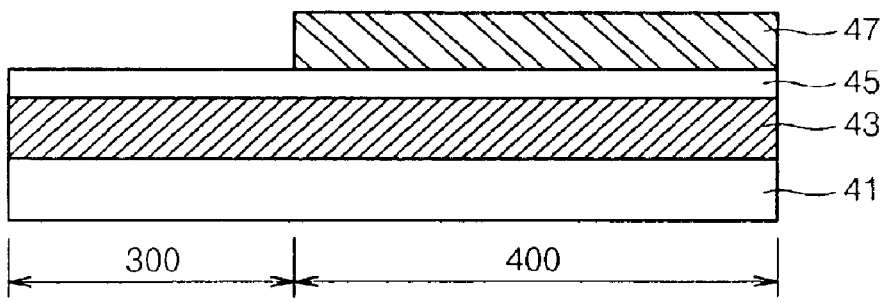

Referring to FIG. 2c, a first photoresist film pattern 47 is formed on the second interlayer insulating film 45 in the peripheral circuit region 400. The first photoresist film pattern 47 is preferably formed by coating a photoresist film on the entire surface of the resultant structure and then removing the photoresist film in the cell region 300 according to exposure and development processes using a cell mask (not shown).

Figure 2D:
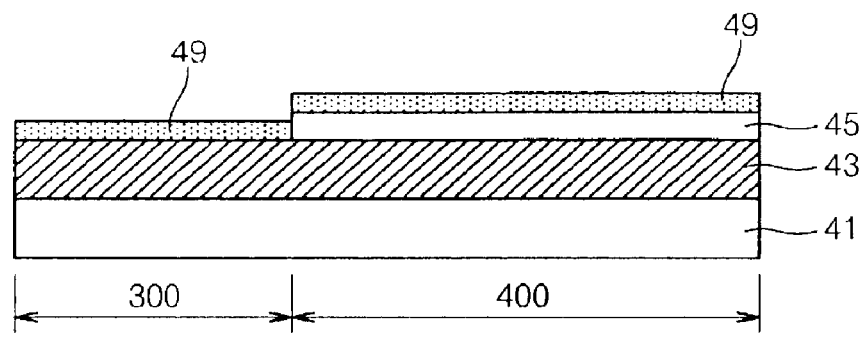

Referring to FIG. 2d, the second interlayer insulating film 45 is etched using the first photoresist film pattern 47 as a mask to expose the connection layer 43 in the cell region 300.

The etching process of the second interlayer insulating film 45 can be carried out more easily than the etching process of the MTJ layer because the interlayer insulating layer includes one insulating layer rather than multi-layer metals as the MTJ layer does.

Thereafter, the first photoresist film pattern 47 is removed, and an MTJ layer 49 having a thickness ranging from about 450 to about 550 Å is deposited on the top surface of the resultant structure.

Here, the MTJ layer 49 has a stacked structure of a semi-ferromagnetic layer, a pinned ferromagnetic layer and a free ferromagnetic layer. Each layer is deposited according to physical vapor deposition.

Figure 2E:
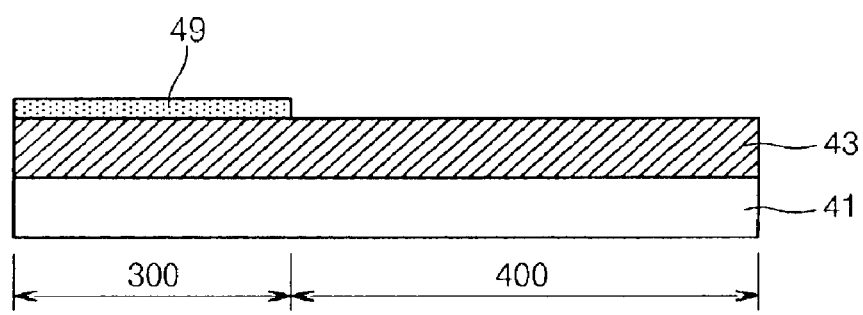

Referring to FIG. 2e, the second interlayer insulating film 45 the sidewall of which is exposed due to difference in deposition thickness between the second interlayer insulating film 45 and the MTJ layer 49 is lifted off to remove the second interlayer insulating film 45 and the MTJ layer 49 at the same time. As a result, only the MTJ layer 49 in the cell region 300 remains.

Figure 2F:
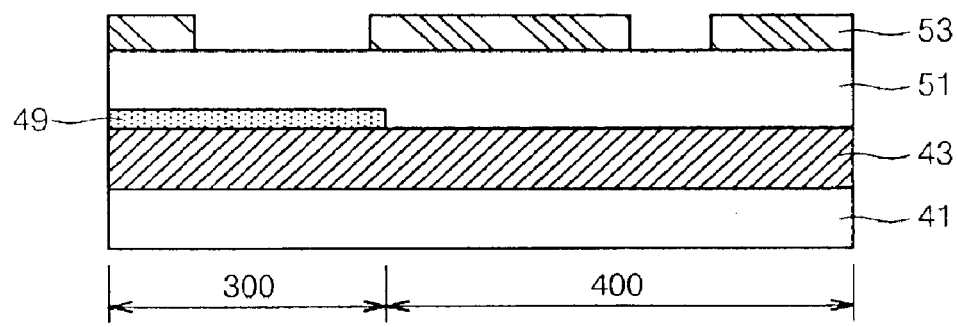

Referring to FIG. 2f, a third interlayer insulating film 51 planarizing the top surface of the resultant structure is formed.

A second photoresist film pattern 53 is formed on the third interlayer insulating film 51.

Preferably, the second photoresist film pattern 53 is formed with exposure and development processes using a separate exposure mask (not shown) which is composite of an MTJ mask exposing an MTJ active region in the cell region 300 and a contact mask exposing a contact region in the connection layer 43 which is a lower read layer in the peripheral circuit region 400.

Figure 2G:
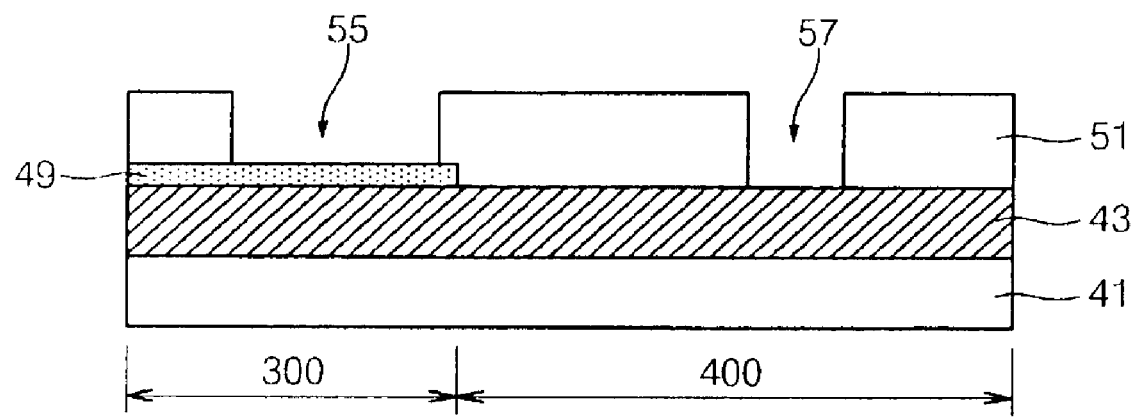

Referring to FIG. 2g, a first contact hole 55 exposing the MTJ layer 49 in the cell region 300 and a second contact hole 57 exposing the connection layer 43 in the peripheral circuit region 400 are respectively formed using the second photoresist film pattern 53 as a mask.

Here, the contact hole etching process is preferably performed by utilizing differences in the etching selectivity ratio among the third interlayer insulating film 53, the connection layer which is the metal layer and the MTJ layer 49.

Figure 2H:
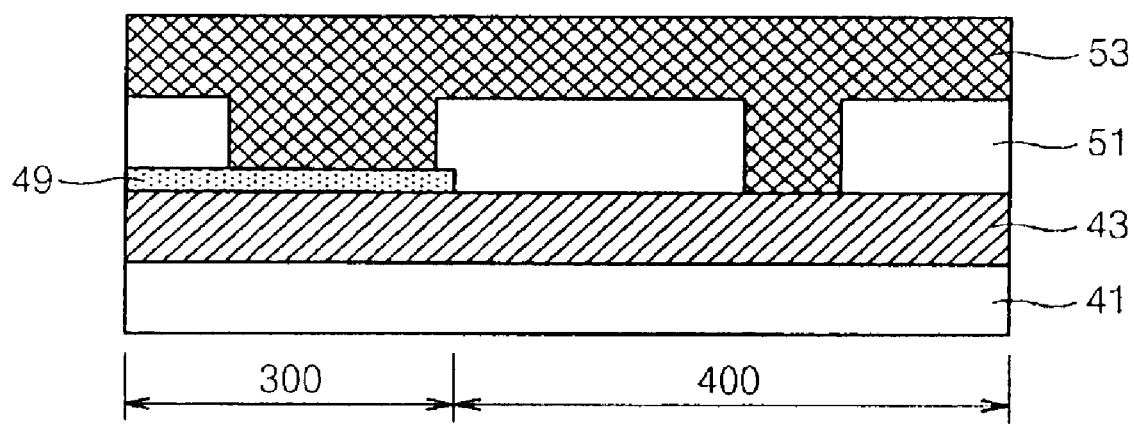

Referring to FIG. 2h, a bit line 59 which is an upper read layer connected to the MTJ layer 49 and the connection layer 43 is formed on the top surface of the resultant structure.

The MTJ layer 49 connected to the bit line 59 is used as an MTJ cell.

The MTJ cell is a resistance variation device composing the MRAM such as a transistor, and can be formed from various magneto resistive devices whose resistance values are varied by magnetization or magnetism, such as AMR, GMR, spin valve, ferromagnetic substance/metal-semiconductor hybrid structure, III–V group magnetic semiconductor composite structure, metal (semi-metal)/semiconductor composite structure and clossal magneto-resistance (CMR), and phase transformation devices whose resistance values are varied according to material phase transformation by an electric signal.

As discussed earlier, the property and the reliability of the MRAM are improved by preventing damage to the connection layer which is the lower read layer and by increasing the effective area of the MTJ cell. This is achieved by forming the MTJ layer in the cell region according to the lift-off process and forming the bit line which is the upper lead line for defining the MTJ cell region.

As the disclosed methods may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a magnetic random access memory, the method comprising:
    forming a lower read layer on a cell region and peripheral circuit region of a semiconductor substrate;
    forming an interlayer insulating film on the lower read layer;
    etching a first portion of the interlayer insulating film disposed over the cell region to expose a portion of the lower read layer disposed over the cell region;
    forming a MTJ layer on the exposed portion of lower read layer and on a second portion of the interlayer insulating film disposed over the peripheral circuit region, wherein the MTJ layer has a thickness less than a thickness of the interlayer insulating film to thereby expose a sidewall of the interlayer insulating film insulating film disposed laterally between the cell and peripheral circuit regions;
    lifting off the MTJ layer and the interlayer insulating film disposed over the peripheral circuit region; and
    forming a bit line which is an upper read layer connected to the MTJ layer.

2. The method according to claim 1, wherein the lower read layer is a connection layer.

3. The method according to claim 1, wherein the MTJ layer has a thickness which is 500 to 5000 Å less than that of the interlayer insulating film.

4. The method according to claim 1, wherein the MTJ layer comprises a stacked structure of a pinned ferromagnetic layer, a tunnel barrier layer and a free ferromagnetic layer.

5. The method according to claim 1, wherein the MTJ layer has a thickness ranging from 450 to 600 Å.

6. A method for manufacturing a magnetic random access memory, comprising the steps of:
    forming a lower read layer on a cell region and a peripheral circuit region of a semiconductor substrate;
    forming a first interlayer insulating film on the lower read layer;
    etching a first portion of the first interlayer insulating film disposed over the cell region to expose a first portion of the lower read layer disposed over the cell region;
    forming an MTJ layer on the exposed first portion of the lower read layer and on a second portion of the first insulating film disposed over the peripheral circuit region wherein the MTJ layer has a thickness that is less than a thickness of the first interlayer insulating film to partially expose a sidewall of the first interlayer insulating film disposed between the cell and peripheral circuit regions;
    lifting off the MTJ layer and the second portion of the first interlayer insulating film disposed over the peripheral circuit region;
    forming a second interlayer insulating film having a first contact hole and a second contact hole respectively exposing an MTJ active region disposed over the cell region and the lower read layer disposed over the peripheral circuit region; and
    forming a bit line which is an upper read layer and filling the first contact hole and the second contact holes.

7. The method according to claim 6, wherein the lower read layer is a connection layer comprising a metal.

8. The method according to claim 6, wherein the MTJ layer has a thickness ranging from 500 to 5000 Å less than that of the interlayer insulating film.

9. The method according to claim 6, wherein the MTJ layer comprises a stacked structure of a pinned ferromagnetic layer, a tunnel barrier layer and a free ferromagnetic layer.

10. The method according to claim 6, wherein the MTJ layer has a thickness ranging from 450 to 600 Å.

11. The method according to claim 6, wherein the forming of the second interlayer insulating film comprises photo etching process wherein an exposure mask which is a composite of an MTJ mask exposing the MTJ active region of the cell region and a contact mask exposing a lower read layer contact region of the peripheral circuit region.

* * * * *

UNITED STATES PATENT AND TRADEMARK OFFICE
CERTIFICATE OF CORRECTION

PATENT NO.     : 6,914,003 B2
DATED          : July 5, 2005
INVENTOR(S)    : Kye N. Lee et al.

It is certified that error appears in the above-identified patent and that said Letters Patent is hereby corrected as shown below:

Title page,
Item [75], Inventors, after each inventor name, "Ichon-shi" should be
-- Kyoungki-Do --.

Column 6,
Lines 3-4, "insulating film insulating film" should be -- insulating film --.

Signed and Sealed this

Twenty-seventh Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,914,003 B2
DATED : July 5, 2005
INVENTOR(S) : Kye N. Lee et al.

It is certified that error appears in the above-identified patent and that said Letters Patent is hereby corrected as shown below:

<u>Title page,</u>
Item [75], Inventors, after each inventor name, "Ichon-shi" should be
-- Kyoungki-Do --.

<u>Column 6,</u>
Lines 3-4, "insulating film insulating film" should be -- insulating film --.

Signed and Sealed this

Eleventh Day of October, 2005

JON W. DUDAS
*Director of the United States Patent and Trademark Office*